US012588228B2

(12) United States Patent
Yoshikawa

(10) Patent No.: US 12,588,228 B2
(45) Date of Patent: Mar. 24, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Daiki Yoshikawa, Kanazawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 392 days.

(21) Appl. No.: 18/463,340

(22) Filed: Sep. 8, 2023

(65) Prior Publication Data

US 2024/0322020 A1 Sep. 26, 2024

(30) Foreign Application Priority Data

Mar. 23, 2023 (JP) ................................. 2023-046945

(51) Int. Cl.
*H10D 12/00* (2025.01)
*H10D 8/00* (2025.01)
*H10D 62/13* (2025.01)

(52) U.S. Cl.
CPC ............. *H10D 12/411* (2025.01); *H10D 8/00* (2025.01); *H10D 62/142* (2025.01)

(58) Field of Classification Search
CPC ......... H10D 12/411–491; H10D 12/00; H10D 8/00; H10D 62/142
See application file for complete search history.

(56) References Cited

U.S. PATENT DOCUMENTS

| | | | |
|---|---|---|---|
| 2022/0181471 A1 | 6/2022 | Miyata et al. | |
| 2022/0415884 A1 | 12/2022 | Toriyama et al. | |
| 2023/0299077 A1* | 9/2023 | Muramatsu | H10D 64/519 |
| | | | 257/140 |
| 2024/0405110 A1* | 12/2024 | Osawa | H10D 12/481 |

FOREIGN PATENT DOCUMENTS

| | | |
|---|---|---|
| JP | 2021040071 A | 3/2021 |
| JP | 2021144998 A | 9/2021 |
| JP | 2022015194 A | 1/2022 |
| JP | 2022181471 A | 12/2022 |

* cited by examiner

*Primary Examiner* — Wasiul Haider
(74) *Attorney, Agent, or Firm* — Maier & Maier, PLLC

(57) ABSTRACT

According to one embodiment, a semiconductor device includes first and second electrodes, and first and second regions. The second electrode includes a contact part protruding toward the first electrode. The first region includes a first semiconductor region of a first conductivity type, a second semiconductor region of a second conductivity type, a third semiconductor region of the first conductivity type including a first part and a second part, a gate electrode, a fourth semiconductor region of the first conductivity type, and a fifth semiconductor region of the second conductivity type. The third semiconductor region includes a first part and a second part. The fourth semiconductor region is arranged with the first part in a third direction. The fifth semiconductor region is located on the third semiconductor region, contacts the contact part in the second direction, and is arranged with the second part in the third direction.

8 Claims, 14 Drawing Sheets

SEMICONDUCTOR DEVICE

CROSS-REFERENCE TO RELATED APPLICATIONS

This application is based upon and claims the benefit of priority from Japanese Patent Application No. 2023-046945, filed on Mar. 23, 2023; the entire contents of which are incorporated herein by reference.

FIELD

Embodiments of the invention generally relate to a semiconductor device.

BACKGROUND

Semiconductor devices used in power conversion and the like include reverse conducting insulated gate bipolar transistors (RC-IGBTs) in which a diode is embedded in an insulated gate bipolar transistor (IGBT). Technology is desirable in which the diode of such a semiconductor device can operate faster.

DETAILED DESCRIPTION

Figure 1:
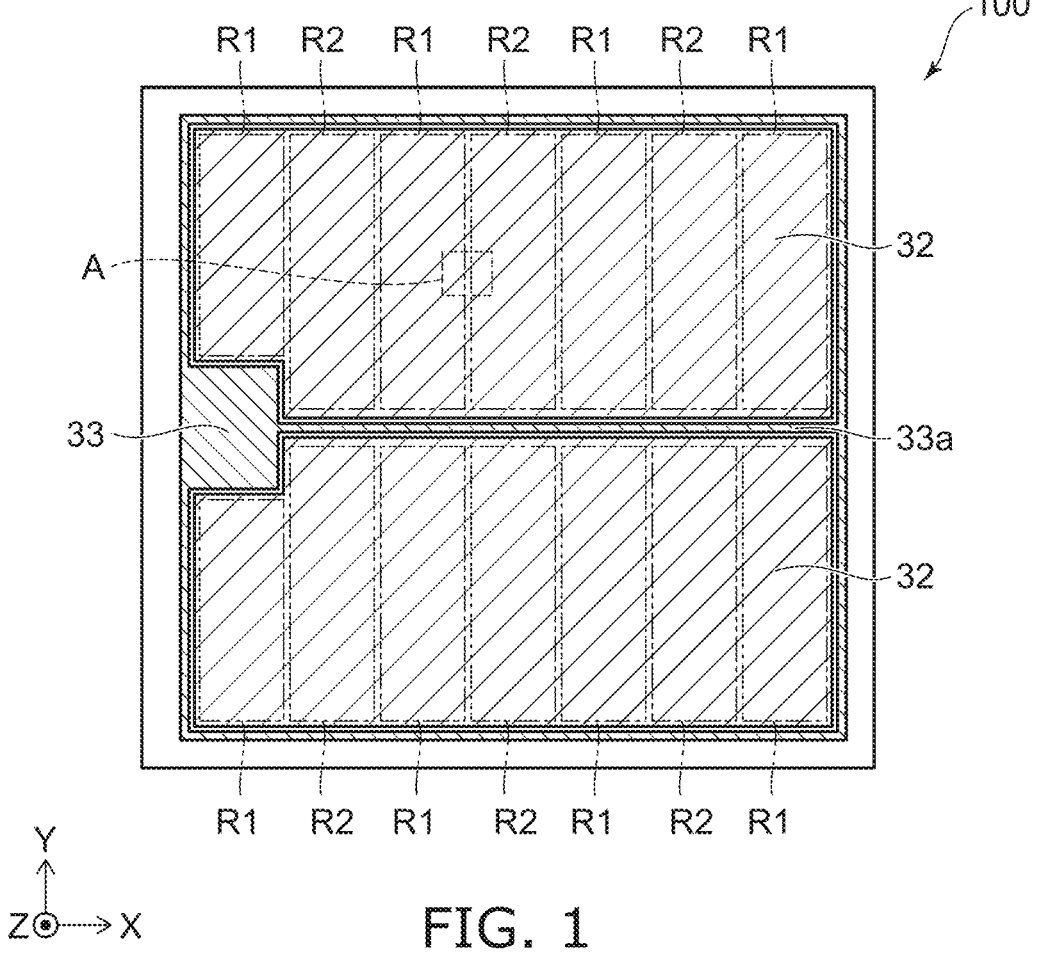
FIG. 1 is a plan view of a semiconductor device according to an embodiment.

According to one embodiment, a semiconductor device includes a first electrode, a second electrode, a first region, and a second region. The second electrode includes a contact part protruding toward the first electrode, and is separated from the first electrode. The first region is located on a portion of the first electrode and positioned between the first electrode and the second electrode. The first region includes a first semiconductor region of a first conductivity type, a second semiconductor region of a second conductivity type, a third semiconductor region of the first conductivity type, a gate electrode, a fourth semiconductor region of the first conductivity type, and a fifth semiconductor region of the second conductivity type. A portion of the second semiconductor region is located on the first semiconductor region. The third semiconductor region is located on the portion of the second semiconductor region, and includes a first part and a second part. The gate electrode faces the third semiconductor region via a gate insulating layer in a second direction perpendicular to a first direction that is from the first electrode toward the second electrode. The fourth semiconductor region is located between the third semiconductor region and the contact part in the first direction. The fourth semiconductor region has a higher first-conductivity-type impurity concentration than the third semiconductor region. The fourth semiconductor region is arranged with the first part in a third direction perpendicular to the first and second directions. The fifth semiconductor region is located on the third semiconductor region, and contacts the contact part in the second direction. The fifth semiconductor region is arranged with the second part in the third direction. The second region is located on an other portion of the first electrode and positioned between the first electrode and the second electrode. The second region includes a sixth semiconductor region of the second conductivity type, an other portion of the second semiconductor region, and a seventh semiconductor region of the first conductivity type. The sixth semiconductor region has a higher second-conductivity-type impurity concentration than the second semiconductor region. The other portion of the second semiconductor region is located on the sixth semiconductor region. The seventh semiconductor region is located on the other portion of the second semiconductor region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing therein above are marked with like reference numerals, and a detailed description is omitted as appropriate.

In the following description, the notations "n⁺", "n" and "n⁻" and the notations "p⁺" and "p" represent the relative levels of impurity concentrations of the conductivity types. Specifically, the notation "n⁺" indicates that the n-type impurity concentration is relatively higher than the notation "n", and the notation "n⁻" indicates that the n-type impurity concentration is relatively lower than the notation "n". The notation "p⁺" indicates that the p-type impurity concentration is relatively higher than the notation "p".

The embodiments described below may be carried out with the p-type and the n-type of the semiconductor regions inverted.

Figure 2:
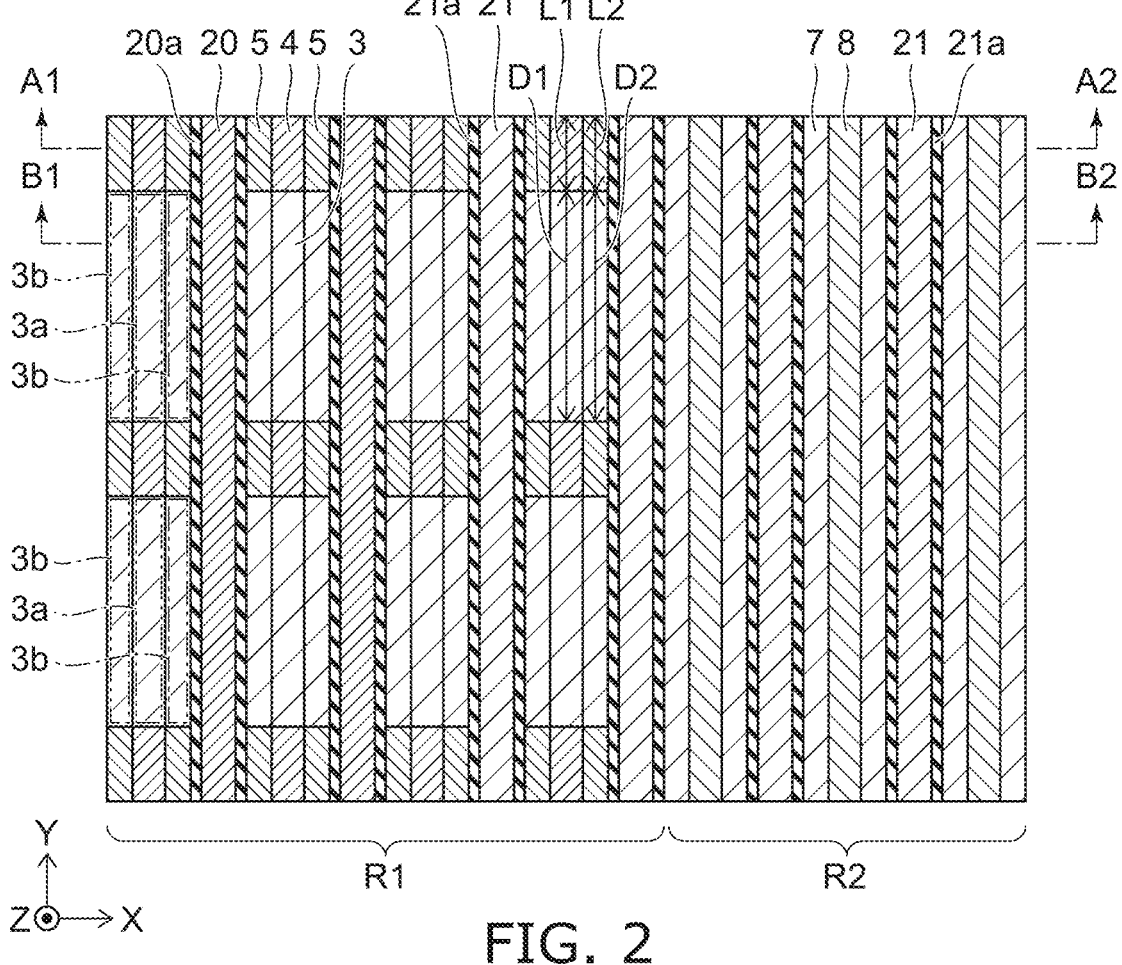
FIG. 2 is an enlarged plan view of portion A of FIG. 1.
Figure 3:
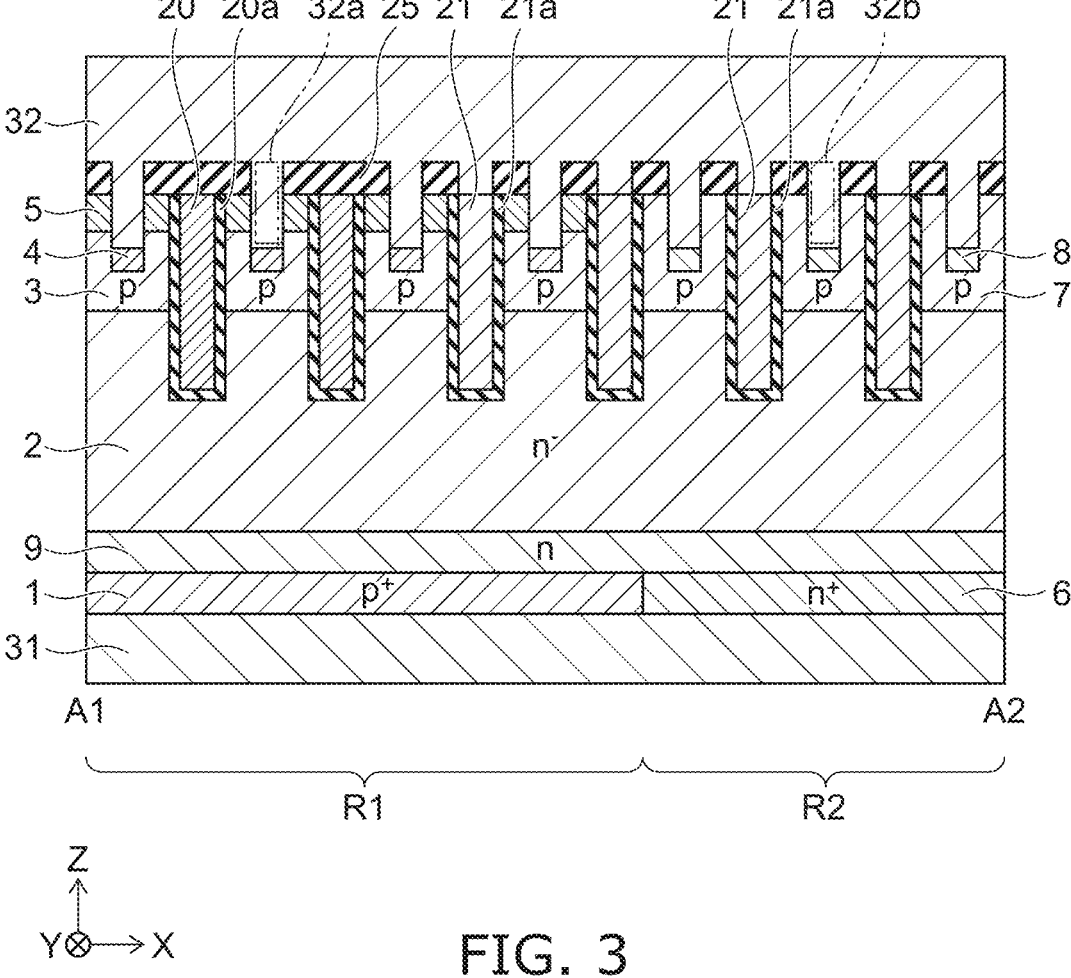
FIG. 3 is an A1-A2 cross-sectional view of FIG. 2.
Figure 4:
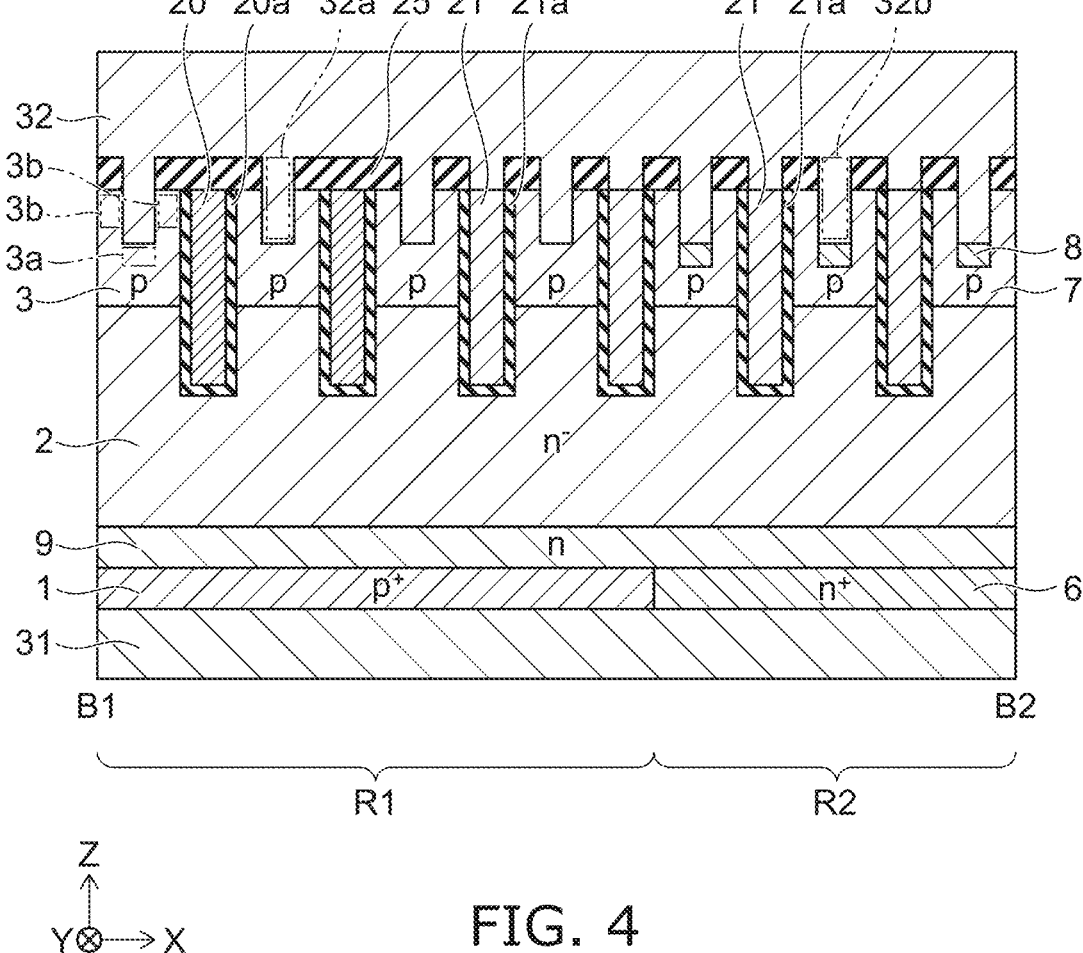
FIG. 4 is a B1-B2 cross-sectional view of FIG. 2.

FIG. 1 is a plan view of a semiconductor device according to an embodiment. FIG. 2 is an enlarged plan view of portion A of FIG. 1. FIG. 3 is an A1-A2 cross-sectional view of FIG. 2. FIG. 4 is a B1-B2 cross-sectional view of FIG. 2. An insulating layer 25 and an emitter electrode 32 are not illustrated in FIG. 2.

The semiconductor device according to the embodiment is an RC-IGBT. As shown in FIGS. 1 to 4, the semiconductor device 100 according to the embodiment includes a p⁺-type (first-conductivity-type) collector region 1 (a first semiconductor region), an n⁻-type (second-conductivity-type) base region 2 (a second semiconductor region), a p-type base region 3 (a third semiconductor region), a p⁺-type contact region 4 (a fourth semiconductor region), an n$^+$-type emitter region 5 (a fifth semiconductor region), an n$^+$-type cathode region 6 (a sixth semiconductor region), a p-type anode region 7 (a seventh semiconductor region), a p$^+$-type anode region 8, a gate electrode 20, a conductive part 21, the insulating layer 25, a collector electrode 31 (a first electrode), the emitter electrode 32 (a second electrode), and a gate pad 33.

An XYZ orthogonal coordinate system is used in the description of embodiments. The direction from the collector electrode 31 toward the emitter electrode 32 is taken as a Z-direction (a first direction). Two mutually-orthogonal directions perpendicular to the Z-direction are taken as an X-direction (a second direction) and a Y-direction (a third direction). In the description, the direction from the collector electrode 31 toward the emitter electrode 32 is called "up", and the opposite direction is called "down". These directions are based on the relative positional relationship of the collector electrode 31 and the emitter electrode 32 and are independent of the direction of gravity.

As shown in FIG. 1, the emitter electrode 32 and the gate pad 33 are located at the upper surface of the semiconductor device 100. The emitter electrode 32 and the gate pad 33 are separated from each other. For example, multiple emitter electrodes 32 are arranged in the Y-direction. A gate wiring part 33a is located around the emitter electrodes 32. A portion of the gate wiring part 33a extends in the Y-direction between the emitter electrodes 32. The gate wiring part 33a is electrically connected with the gate pad 33.

As shown in FIGS. 1 and 2, the semiconductor device 100 includes an IGBT region R1 (a first region) and a diode region R2 (a second region). In the example shown in FIG. 1, multiple IGBT regions R1 and multiple diode regions R2 are arranged in the X-direction and the Y-direction. The IGBT region R1 and the diode region R2 are alternately arranged in the X-direction.

As shown in FIGS. 3 and 4, the collector electrode 31 is located at the lower surface of the semiconductor device 100. The collector electrode 31 and the emitter electrode 32 are separated from each other; and the multiple IGBT regions R1 and the multiple diode regions R2 are positioned between the collector electrode 31 and the emitter electrode 32.

As shown in FIGS. 2 to 4, the p$^+$-type collector region 1, a portion of the n$^-$-type base region 2, the p-type base region 3, the p$^+$-type contact region 4, the n$^+$-type emitter region 5, and the gate electrode 20 are located in each IGBT region R1.

The p$^+$-type collector region 1 is located on a portion of the collector electrode 31 and is electrically connected with the collector electrode 31. A portion of the n$^-$-type base region 2 is located on the p$^+$-type collector region 1. The p-type base region 3 is located on the portion of the n$^-$-type base region 2 and positioned on the p$^+$-type collector region 1.

As shown in FIG. 4, the p-type base region 3 includes a first part 3a and a second part 3b. The emitter electrode 32 includes a contact part 32a protruding toward the collector electrode 31. The first part 3a contacts the contact part 32a in the Z-direction. The second part 3b is positioned higher than the first part 3a and contacts the contact part 32a in the X-direction.

As shown in FIG. 3, the p$^+$-type contact region 4 is located between the p-type base region 3 and the contact part 32a in the Z-direction and contacts the contact part 32a. As shown in FIG. 2, the p$^+$-type contact region 4 is arranged with the first part 3a in the Y-direction. The p-type impurity concentration of the p$^+$-type contact region 4 is greater than the p-type impurity concentration of the p-type base region 3.

As shown in FIG. 3, the n$^+$-type emitter region 5 is located on the p-type base region 3. The n$^+$-type emitter region 5 is positioned higher than the p$^+$-type contact region 4 and contacts the contact part 32a in the X-direction. As shown in FIG. 2, the n$^+$-type emitter region 5 is arranged with the second part 3b in the Y-direction.

The gate electrode 20 faces the p-type base region 3 via a gate insulating layer 20a in the X-direction. In the illustrated example, the gate electrode 20 also faces both the n$^-$-type base region 2 and the n$^+$-type emitter region 5 via the gate insulating layer 20a.

The emitter electrode 32 is electrically connected with the p-type base region 3, the p$^+$-type contact region 4, and the n$^+$-type emitter region 5. The insulating layer 25 is located between the gate electrode 20 and the emitter electrode 32 and electrically isolates the gate electrode 20 and the emitter electrode 32 from each other.

As shown in FIGS. 2 to 4, multiple p-type base regions 3, multiple gate electrodes 20, and multiple contact parts 32a are arranged in the X-direction in one IGBT region R1. The multiple p-type base regions 3, the multiple gate electrodes 20, and the multiple contact parts 32a each are provided in stripe shapes and extend in the Y-direction. The Y-direction end portions of the gate electrode 20 are electrically connected with the gate wiring part 33a. The gate electrodes 20 are electrically connected with the gate pad 33 via the gate wiring part 33a.

As shown in FIG. 2, multiple p$^+$-type contact regions 4 and multiple n$^+$-type emitter regions 5 are arranged in the Y-direction on one p-type base region 3. The p$^+$-type contact region 4 and the first part 3a are alternately arranged in the Y-direction. The n$^+$-type emitter region 5 and the second part 3b are alternately arranged in the Y-direction.

The n$^+$-type cathode region 6, another portion of the n$^-$-type base region 2, the p-type anode region 7, the p$^+$-type anode region 8, and the conductive part 21 are located in each diode region R2. The n$^+$-type cathode region 6 is located on another portion of the collector electrode 31 and is electrically connected with the collector electrode 31. The other portion of the n$^-$-type base region 2 is located on the n$^+$-type cathode region 6. The p-type anode region 7 is located on the other portion of the n$^-$-type base region 2 and positioned on the n$^+$-type cathode region 6.

The conductive part 21 faces the p-type anode region 7 via an insulating layer 21a in the X-direction. The p$^+$-type anode region 8 is located on the p-type anode region 7. The p-type impurity concentration of the p$^+$-type anode region 8 is greater than the p-type impurity concentration of the p-type anode region 7. The p-type anode region 7, the p$^+$-type anode region 8, and the conductive part 21 are electrically connected with the emitter electrode 32.

As shown in FIGS. 2 to 4, the emitter electrode 32 may include a contact part 32b protruding toward the collector electrode 31. A portion of the p-type anode region 7 is arranged with the contact part 32b in the X-direction. The p$^+$-type anode region 8 is located between the p-type anode region 7 and the emitter electrode 32 in the Z-direction.

In one diode region R2, multiple p-type anode regions 7, multiple p$^+$-type anode regions 8, and multiple conductive parts 21 are arranged in the X-direction. The multiple p-type anode regions 7, the multiple p$^+$-type anode regions 8, and the multiple conductive parts 21 are provided in stripe shapes and extend in the Y-direction.

Operations of the semiconductor device 100 will now be described.

A voltage that is not less than a threshold is applied to the gate electrode 20 in a state in which a positive voltage with respect to the emitter electrode 32 is applied to the collector electrode 31. A channel (an inversion layer) is thereby formed in the p-type base region 3. Electrons flow from the $n^+$-type emitter region 5 to the $n^-$-type base region 2 via the channel; and holes flow from the $p^+$-type collector region 1 toward the $n^-$-type base region 2. The density of the carriers accumulated in the $n^-$-type base region 2 increases, and conductivity modulation occurs. The electrical resistance in the $n^-$-type base region 2 is greatly reduced thereby, and the IGBT region R1 is set to the on-state. Subsequently, when the voltage applied to the gate electrode 20 drops below the threshold, the channel in the p-type base region 3 disappears, and the IGBT region R1 is switched to the off-state.

After the IGBT region R1 is switched to the off-state, the electrons that accumulated in the $n^-$-type base region 2 are discharged to the collector electrode 31 via the $p^+$-type collector region 1. The holes are discharged to the emitter electrode 32 via the p-type base region 3.

For example, a bridge circuit is configured using multiple semiconductor devices 100. When one semiconductor device 100 is switched from the on-state to the off-state, the inductance component of the bridge circuit applies an induced electromotive force to the emitter electrode 32 of another semiconductor device 100. As a result, the diode region R2 of the other semiconductor device 100 operates. Holes flow from the p-type anode region 7 to the $n^-$-type base region 2; and electrons flow from the $n^+$-type cathode region 6 to the $n^-$-type base region 2. The diode region R2 functions as a freewheeling diode (FWD).

As shown in FIGS. 3 and 4, an n-type buffer region 9 may be provided between the $p^+$-type collector region 1 and the $n^-$-type base region 2 and between the $n^+$-type cathode region 6 and the $n^-$-type base region 2. The n-type impurity concentration of the n-type buffer region 9 is less than the n-type impurity concentration of the $n^+$-type cathode region 6 and greater than the n-type impurity concentration of the $n^-$-type base region 2. By providing the n-type buffer region 9, spreading of the depletion layer in the $n^-$-type base region 2 can be more reliably suppressed by the n-type buffer region 9.

In the IGBT region R1, some of the multiple gate electrodes 20 may be replaced with the conductive part 21. By replacing some of the gate electrodes 20 with the conductive part 21, the density of the carriers accumulated in the $n^-$-type base region 2 when the IGBT region R1 is in the on-state can be increased, and the electrical resistance of the semiconductor device 100 can be further reduced.

Examples of the materials of the components of the semiconductor device 100 will now be described.

The $p^+$-type collector region 1, the $n^-$-type base region 2, the p-type base region 3, the $p^+$-type contact region 4, the $n^+$-type emitter region 5, the $n^+$-type cathode region 6, the p-type anode region 7, the $p^+$-type anode region 8, and the n-type buffer region 9 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

The gate electrode 20 and the conductive part 21 include conductive materials such as polysilicon, etc. The gate insulating layer 20a, the insulating layer 21a, and the insulating layer 25 include insulating materials such as silicon oxide, silicon nitride, silicon oxynitride, etc. The collector electrode 31, the emitter electrode 32, the gate pad 33, and the gate wiring part 33a include metals such as titanium, aluminum, etc.

Figure 5:
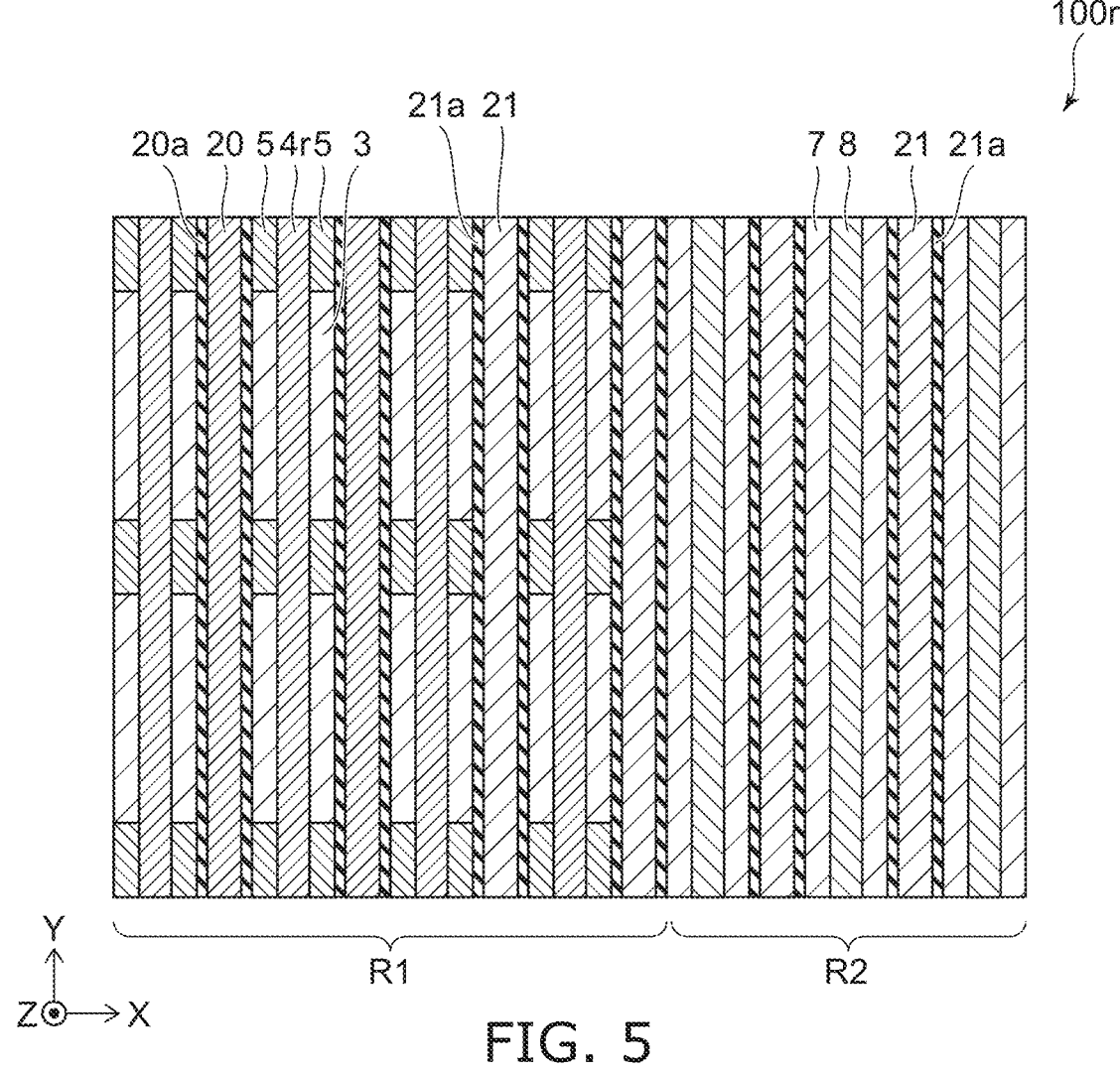
FIG. 5 is a plan view showing a portion of a semiconductor device according to a reference example.

FIG. 5 is a plan view showing a portion of a semiconductor device according to a reference example.

In the semiconductor device 100r according to the reference example shown in FIG. 5, a $p^+$-type contact region 4r that extends in a stripe shape is provided on one p-type base region 3 in the IGBT region R1.

Advantages of the embodiment will now be described.

The semiconductor device 100r includes a parasitic thyristor made of the $p^+$-type collector region 1, the $n^-$-type base region 2, the p-type base region 3, and the $n^+$-type emitter region 5. When the IGBT region R1 is switched to the off-state, holes flow in the p-type base region 3. The parasitic thyristor may operate when the flow of holes causes the potential of the p-type base region 3 to increase. When the parasitic thyristor operates, a large current flows in the semiconductor device 100r, and breakdown of the semiconductor device 100r occurs.

In the semiconductor device 100r, the $p^+$-type contact region 4r is provided under the contact part 32a to suppress the operation of the parasitic thyristor. The p-type impurity concentration of the $p^+$-type contact region 4r is greater than the p-type impurity concentration of the p-type base region 3. When holes flow in the p-type base region 3, the holes are easily discharged to the emitter electrode 32 via the $p^+$-type contact region 4r. The operation of the parasitic thyristor can be suppressed thereby. In other words, the latchup withstand capacity of the semiconductor device 100r can be improved.

On the other hand, the IGBT region R1 also includes a parasitic diode made of the $n^-$-type base region 2 and the p-type base region 3. When the diode region R2 is in the on-state, the parasitic diode of the IGBT region R1 may operate, and holes may flow from the emitter electrode 32 to the $n^-$-type base region 2. In particular, when the $p^+$-type contact region 4r is provided, more holes flow toward the $n^-$-type base region 2 because the electrical resistance between the $p^+$-type contact region 4r and the emitter electrode 32 is low. The carriers that accumulate in the $n^-$-type base region 2 are increased thereby. When the diode region R2 is switched to the off-state, more time is necessary for the carriers accumulated in the $n^-$-type base region 2 to be discharged. As a result, the switching of the diode region R2 from the on-state to the off-state is slower, and the operation speed of the diode region R2 is reduced. The switching loss of the semiconductor device 100 when the diode region R2 operates is increased.

For this problem, in the semiconductor device 100 according to the embodiment, the $p^+$-type contact region 4 is arranged in the Y-direction with the first part 3a of the p-type base region 3. In other words, when comparing the semiconductor device 100r according to the reference example and the semiconductor device 100 according to the embodiment, the Y-direction length of the $p^+$-type contact region 4 is less than the Y-direction length of the $p^+$-type contact region 4r. A portion of the $p^+$-type contact region 4r is replaced with the first part 3a of the p-type base region 3. By providing the $p^+$-type contact region 4 that has a shorter Y-direction length, the amount of holes flowing toward the $n^-$-type base region 2 due to the parasitic diode when the diode region R2 is in the on-state can be reduced. The operation of the diode region R2 can be faster, and the switching loss of the semiconductor device 100 can be reduced.

The $p^+$-type contact region 4 is positioned lower than the $n^+$-type emitter region 5. Therefore, holes that flow toward the $n^+$-type emitter region 5 move to the $p^+$-type contact region 4 before reaching the $n^+$-type emitter region 5 vicinity. The reduction of the latchup withstand capacity can be suppressed because the increase of the potential at the $n^+$-type emitter region 5 vicinity can be suppressed.

According to the semiconductor device 100 according to the embodiment, the diode region R2 can operate faster while suppressing the reduction of the latchup withstand capacity.

It is favorable for the Y-direction position of at least a portion of the $p^+$-type contact region 4 to be the same as the Y-direction position of at least a portion of the $n^+$-type emitter region 5. In other words, as shown in FIG. 2, at least a portion of the $p^+$-type contact region 4 and at least a portion of the $n^+$-type emitter region 5 are adjacent to each other in the X-direction when the $p^+$-type contact region 4 and the $n^+$-type emitter region 5 are viewed in plan. According to this configuration, the holes that flow toward the $n^+$-type emitter region 5 move to the $p^+$-type contact region 4 and are discharged more easily. The increase of the potential at the $n^+$-type emitter region 5 vicinity can be more reliably suppressed, and the latchup withstand capacity of the semiconductor device 100 can be improved.

For example, as shown in FIG. 2, a distance D1 in the Y-direction between the adjacent $p^+$-type contact regions 4 is greater than a length L1 in the Y-direction of the $p^+$-type contact region 4. A distance D2 in the Y-direction between the adjacent $n^+$-type emitter regions 5 is greater than a length L2 in the Y-direction of the $n^+$-type emitter region 5. By providing the $n^+$-type emitter regions 5 with spacing, the saturation current density of the semiconductor device 100 can be reduced. By providing the $p^+$-type contact regions 4 with spacing according to the arrangement of the $n^+$-type emitter regions 5, the injection of holes via the $p^+$-type contact regions 4 can be suppressed, and the diode region R2 can operate faster.

For example, the boundary between the p-type base region 3 and the $p^+$-type contact region 4 is identified using the p-type impurity concentration of the p-type base region 3 and the p-type impurity concentration of the $p^+$-type contact region 4. First, the distribution of the p-type impurity concentration in the region between the gate electrodes 20 is measured. The positions of the p-type base region 3 and the $p^+$-type contact region 4 are roughly determined from the p-type impurity concentration distribution. In other words, the region in which the p-type impurity concentration is relatively low is taken to be the p-type base region 3. The region in which the p-type impurity concentration is relatively high is taken to be the $p^+$-type contact region 4. Then, the p-type impurity concentration of the p-type base region 3 in a region separated from the $n^-$-type base region 2 and the $p^+$-type contact region 4 is determined. Then, the maximum p-type impurity concentration in the $p^+$-type contact region 4 is determined. The set of points between the p-type base region 3 and the $p^+$-type contact region 4 having the intermediate value of the two p-type impurity concentrations is the boundary between the p-type base region 3 and the $p^+$-type contact region 4.

First Modification

Figure 6:
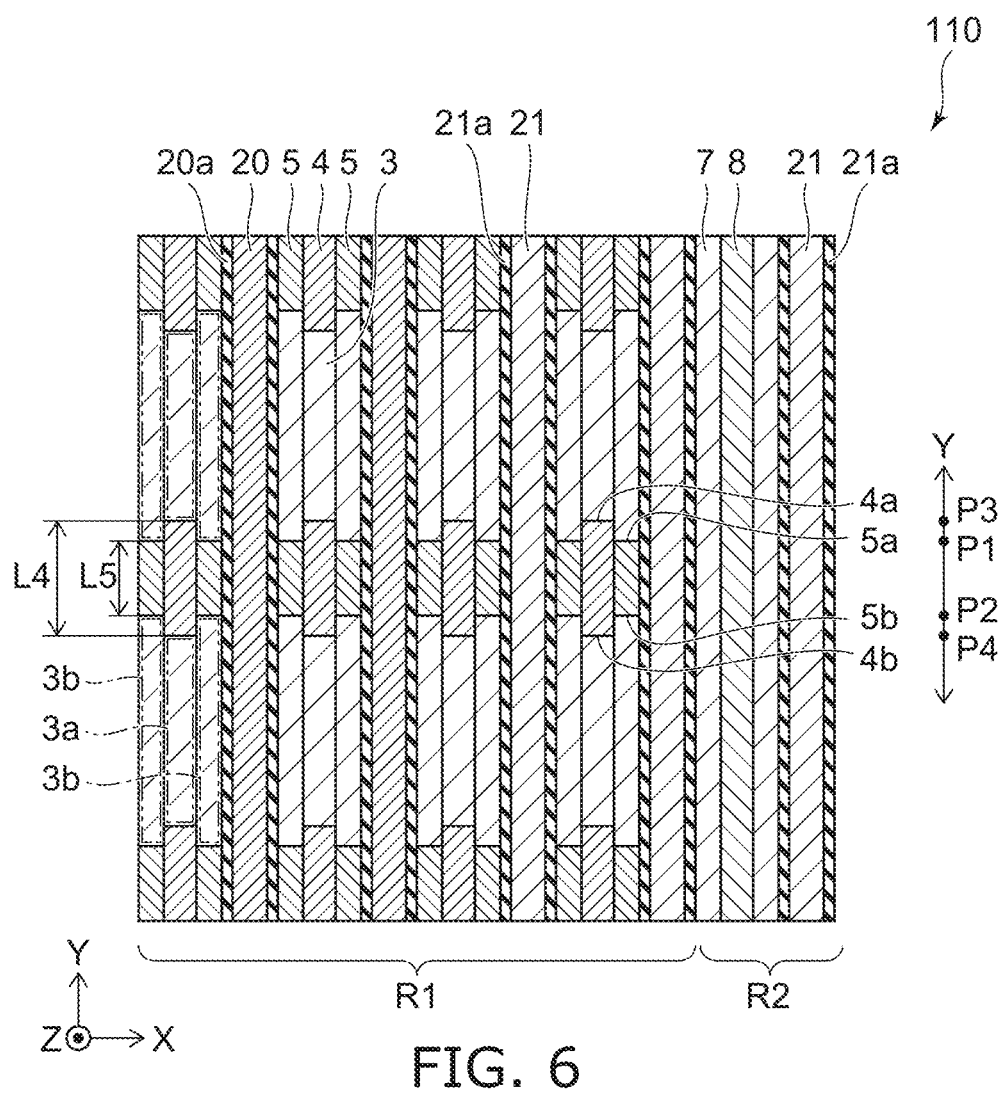
FIG. 6 is a plan view showing a portion of a semiconductor device according to a first modification of the embodiment.

FIG. 6 is a plan view showing a portion of a semiconductor device according to a first modification of the embodiment. The insulating layer 25 and the emitter electrode 32 are not illustrated in FIG. 6.

In the semiconductor device 110 according to the first modification shown in FIG. 6, a length L4 in the Y-direction of the $p^+$-type contact region 4 is greater than a length L5 in the Y-direction of the $n^+$-type emitter region 5. According to the semiconductor device 110 according to the first modification, compared to the semiconductor device 100, the holes that flow in the $n^+$-type emitter region 5 vicinity can be effectively reduced, and the latchup withstand capacity can be further increased.

For example, the $p^+$-type contact region 4 includes an end portion 4a and an end portion 4b in the Y-direction. The $n^+$-type emitter region 5 includes an end portion 5a and an end portion 5b in the Y-direction. To improve the latchup withstand capacity, it is favorable for a position P1 in the Y-direction of the end portion 5a and a position P2 in the Y-direction of the end portion 5b to be between a position P3 in the Y-direction of the end portion 4a and a position P4 in the Y-direction of the end portion 4b.

Second Modification

Figure 7:
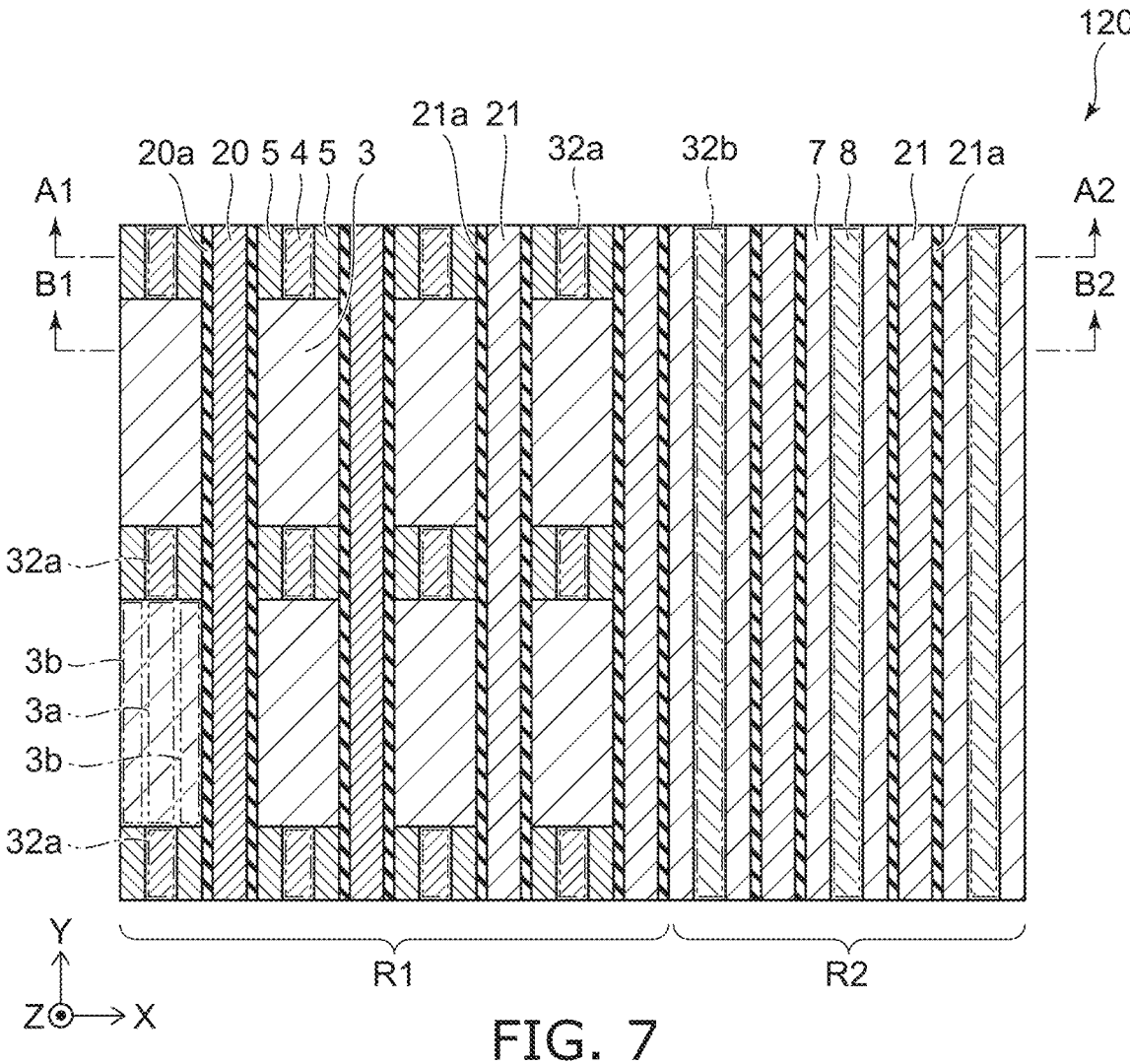
FIG. 7 is a plan view showing a portion of a semiconductor device according to a second modification of the embodiment.
Figure 8:
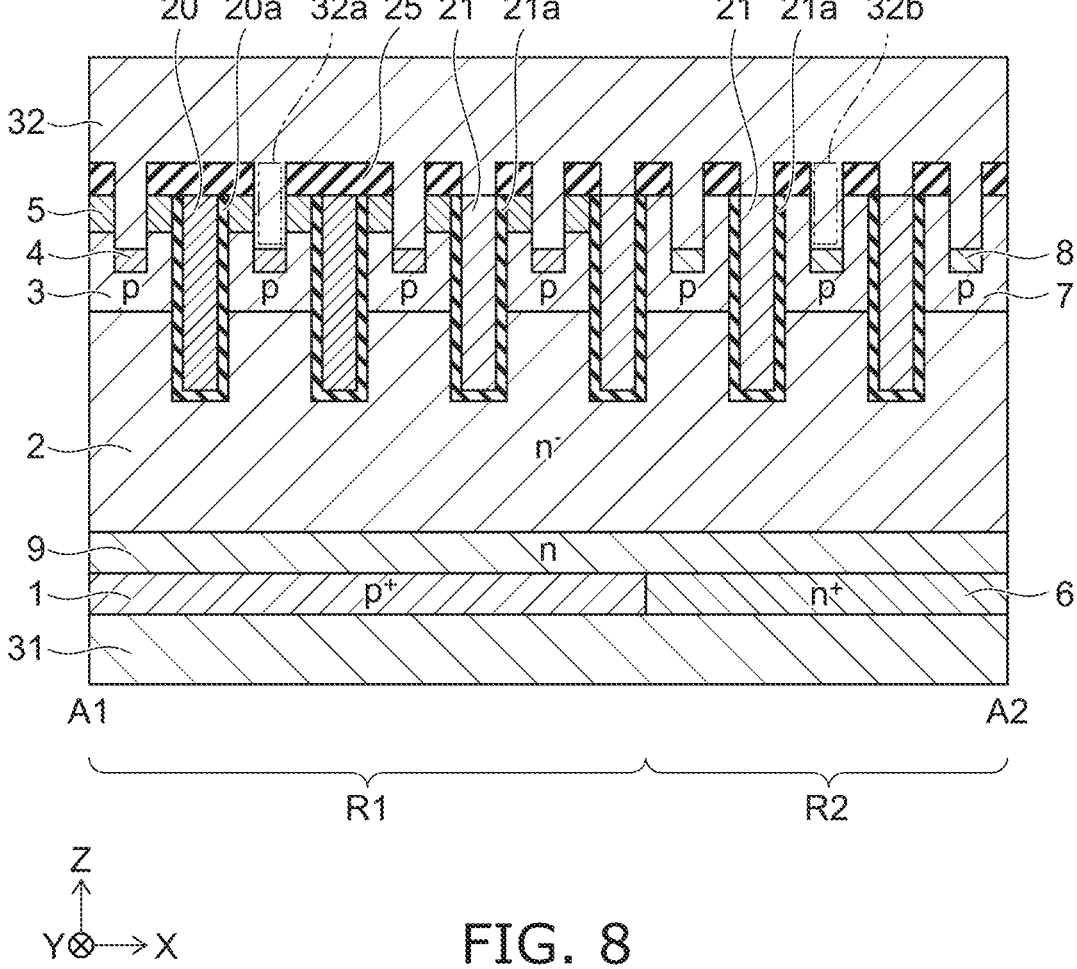
FIG. 8 is an A1-A2 cross-sectional view of FIG. 7.
Figure 9:
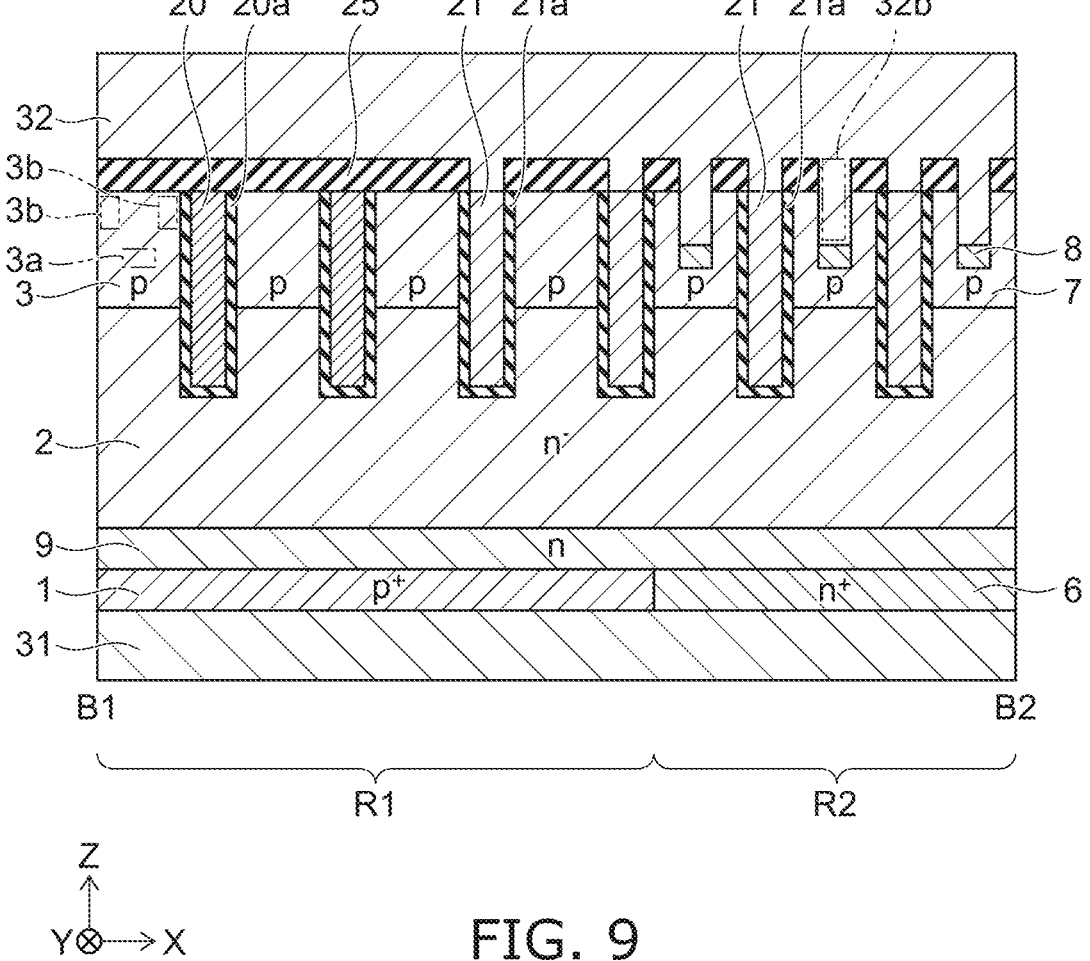
FIG. 9 is a B1-B2 cross-sectional view of FIG. 7.

FIG. 7 is a plan view showing a portion of a semiconductor device according to a second modification of the embodiment. FIG. 8 is an A1-A2 cross-sectional view of FIG. 7. FIG. 9 is a B1-B2 cross-sectional view of FIG. 7. The insulating layer 25 is not illustrated in FIG. 7. The contact part 32a and the contact part 32b of the emitter electrode 32 are illustrated by broken lines; and the other parts of the emitter electrode 32 are not illustrated.

In the semiconductor devices 100 and 110, the contact part 32a extends in the Y-direction. In contrast, in the semiconductor device 120 according to the second modification shown in FIG. 7, multiple contact parts 32a are arranged in the Y-direction on one p-type base region 3.

As shown in FIGS. 7 and 8, the multiple contact parts 32a are located respectively on the multiple $p^+$-type contact regions 4. As shown in FIG. 9, the contact part 32a is not located on the first part 3a. Therefore, the first part 3a and the second part 3b do not contact the contact part 32a.

For example, the contact part 32b extends in the Y-direction. Or, similarly to the contact part 32a, multiple contact parts 32b may be arranged in the Y-direction. In such a case, multiple $p^+$-type anode regions 8 also are arranged in the Y-direction. The multiple contact parts 32b are positioned respectively on the multiple $p^+$-type anode regions 8.

According to the semiconductor device 120 according to the second modification, compared to the semiconductor device 100 or 110, the contact area between the p-type base region 3 and the contact part 32a is small. For example, when the IGBT region R1 is in the on-state, the discharge of holes from the p-type base region 3 to the emitter electrode 32 can be suppressed. The density of the carriers accumulated in the $n^-$-type base region 2 can be further increased thereby. The electrical resistance of the semiconductor device 120 when the IGBT region R1 is in the on-state can be further reduced.

Third Modification

Figure 10:
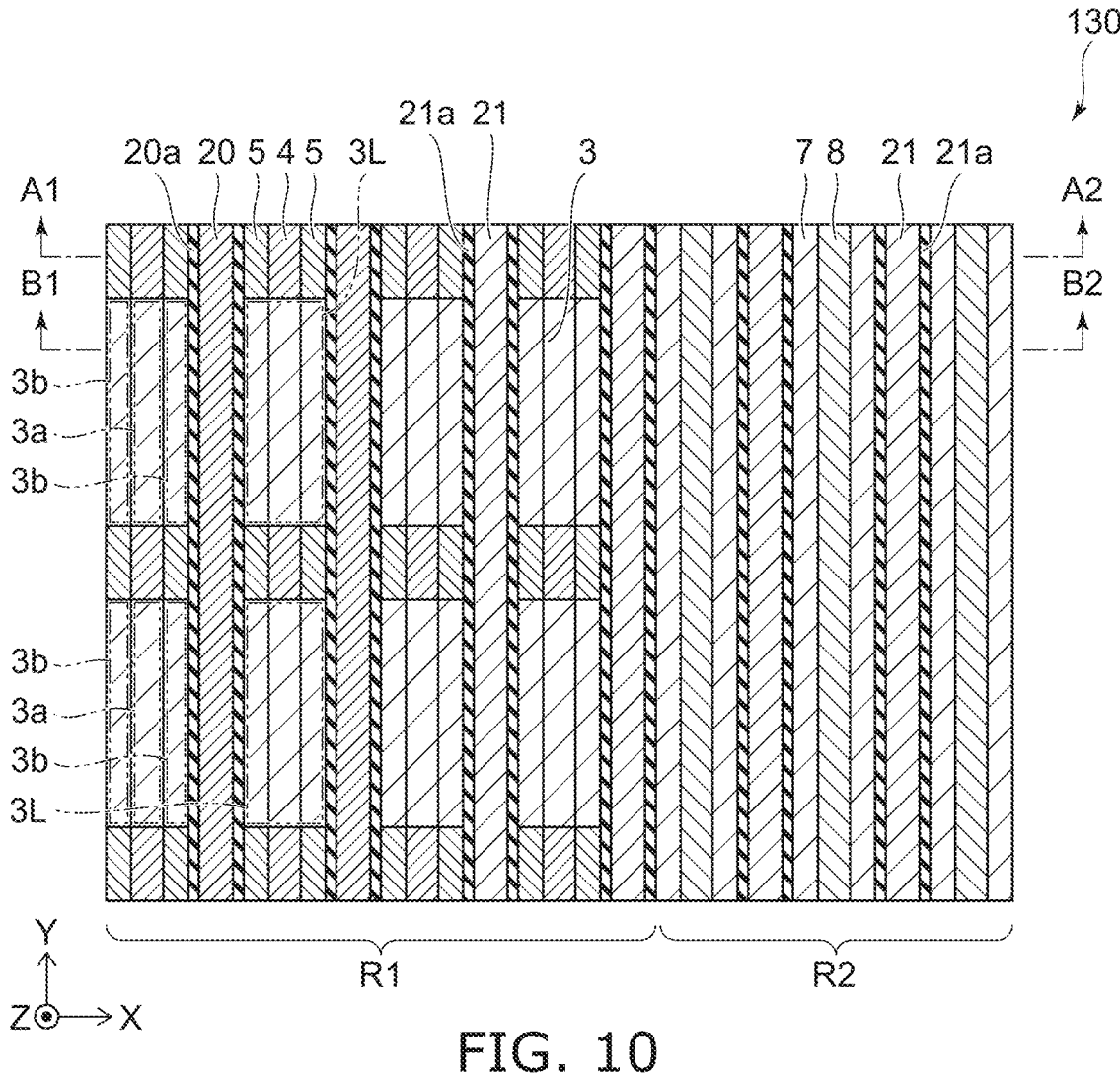
FIG. 10 is a plan view showing a portion of a semiconductor device according to a third modification of the embodiment.
Figure 11:
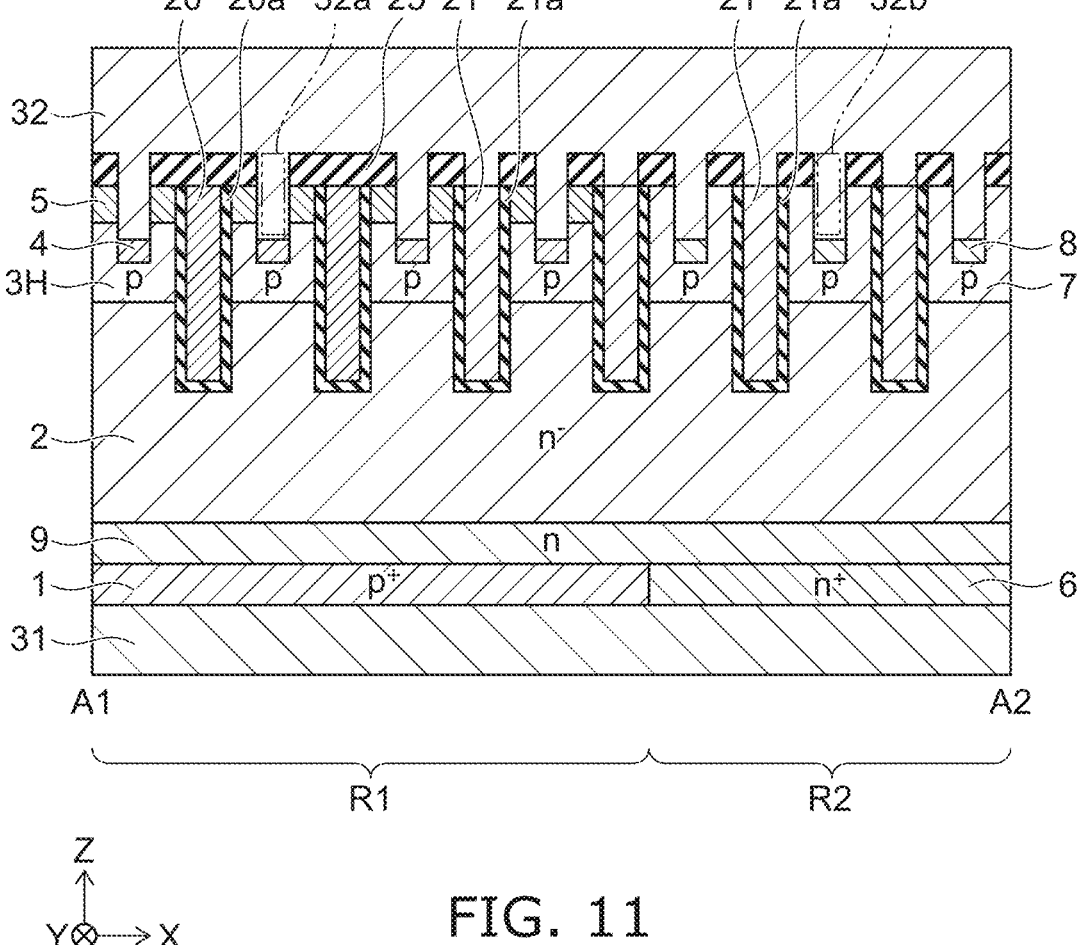
FIG. 11 is an A1-A2 cross-sectional view of FIG. 10.
Figure 12:
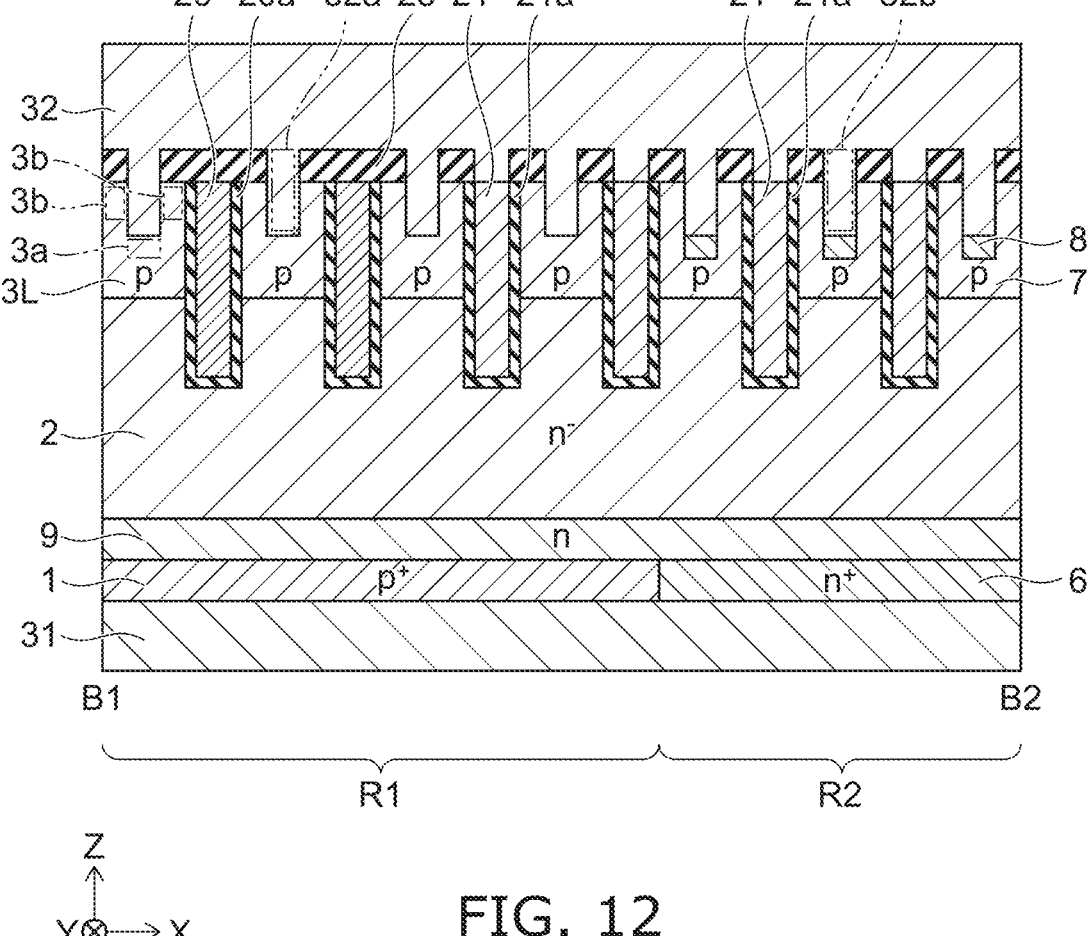
FIG. 12 is a B1-B2 cross-sectional view of FIG. 10.

FIG. 10 is a plan view showing a portion of a semiconductor device according to a third modification of the embodiment. FIG. 11 is an A1-A2 cross-sectional view of FIG. 10. FIG. 12 is a B1-B2 cross-sectional view of FIG. 10. The insulating layer 25 and the emitter electrode are not illustrated in FIG. 10.

In the semiconductor device 130 according to the third modification shown in FIGS. 10 to 12, the p-type base region 3 includes a high-concentration region 3H (a first subregion) and a low-concentration region 3L (a second subregion).

The low-concentration region 3L is arranged with the high-concentration region 3H in the Y-direction. The p-type impurity concentration of the low-concentration region 3L is less than the p-type impurity concentration of the high-concentration region 3H.

The p$^+$-type contact region 4 and the n$^+$-type emitter region 5 are located on the high-concentration region 3H. The first part 3a and the second part 3b are located in the low-concentration region 3L. In other words, the p-type impurity concentration of a region of the p-type base region 3 separated from the p$^+$-type contact region 4 and the n$^+$-type emitter region 5 is less than the p-type impurity concentration of a region of the p-type base region 3 proximate to the p$^+$-type contact region 4 and the n$^+$-type emitter region 5.

When the diode region R2 operates, the holes that flow from the emitter electrode 32 to the p$^+$-type contact region 4 move toward the n$^-$-type base region 2 while spreading not only in the Z-direction but also in the X-direction and the Y-direction. The resistance to the holes increases as the p-type impurity concentration in the p-type base region 3 decreases. When the p-type impurity concentration of the low-concentration region 3L is low, the resistance to the holes flowing from the p$^+$-type contact region 4 to the p-type base region 3 can be increased. The low-concentration region 3L is separated from the p$^+$-type contact region 4 and the n$^+$-type emitter region 5. Therefore, the effects on latchup are small even when the p-type impurity concentration of the low-concentration region 3L is low.

For example, the p-type impurity concentration of the low-concentration region 3L is less than 0.5 times the p-type impurity concentration of the high-concentration region 3H. It is favorable for the p-type impurity concentration of the low-concentration region 3L to be less than 0.1 times the p-type impurity concentration of the high-concentration region 3H. Most favorably, the p-type impurity concentration of the low-concentration region 3L is less than 0.01 times the p-type impurity concentration of the high-concentration region 3H.

According to the semiconductor device 130 according to the third modification, compared to the semiconductor device 100, the injection of holes via the p$^+$-type contact region 4 can be suppressed, and the diode region R2 can operate faster.

Fourth Modification

Figure 13:
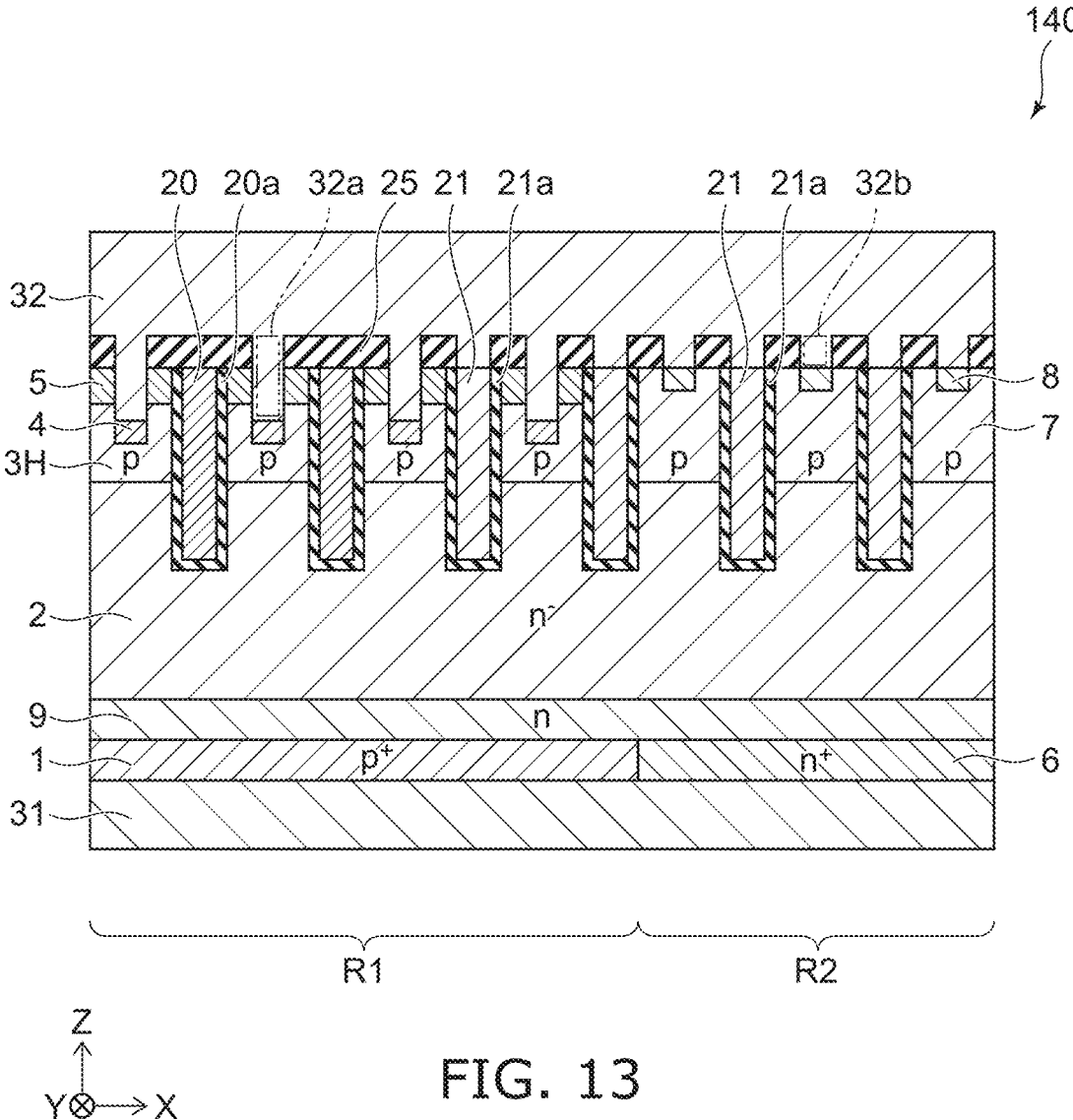
FIG. 13 is a cross-sectional view showing a portion of a semiconductor device according to a fourth modification of the embodiment.

FIG. 13 is a cross-sectional view showing a portion of a semiconductor device according to a fourth modification of the embodiment.

As in the semiconductor device 140 according to the fourth modification shown in FIG. 13, the p$^+$-type anode region 8 may be positioned higher than the p$^+$-type contact region 4. The lower surface of the contact part 32b exists at the same level as the upper surface of the p-type anode region 7 and the upper surface of the p$^+$-type anode region 8.

Fifth Modification

Figure 14:
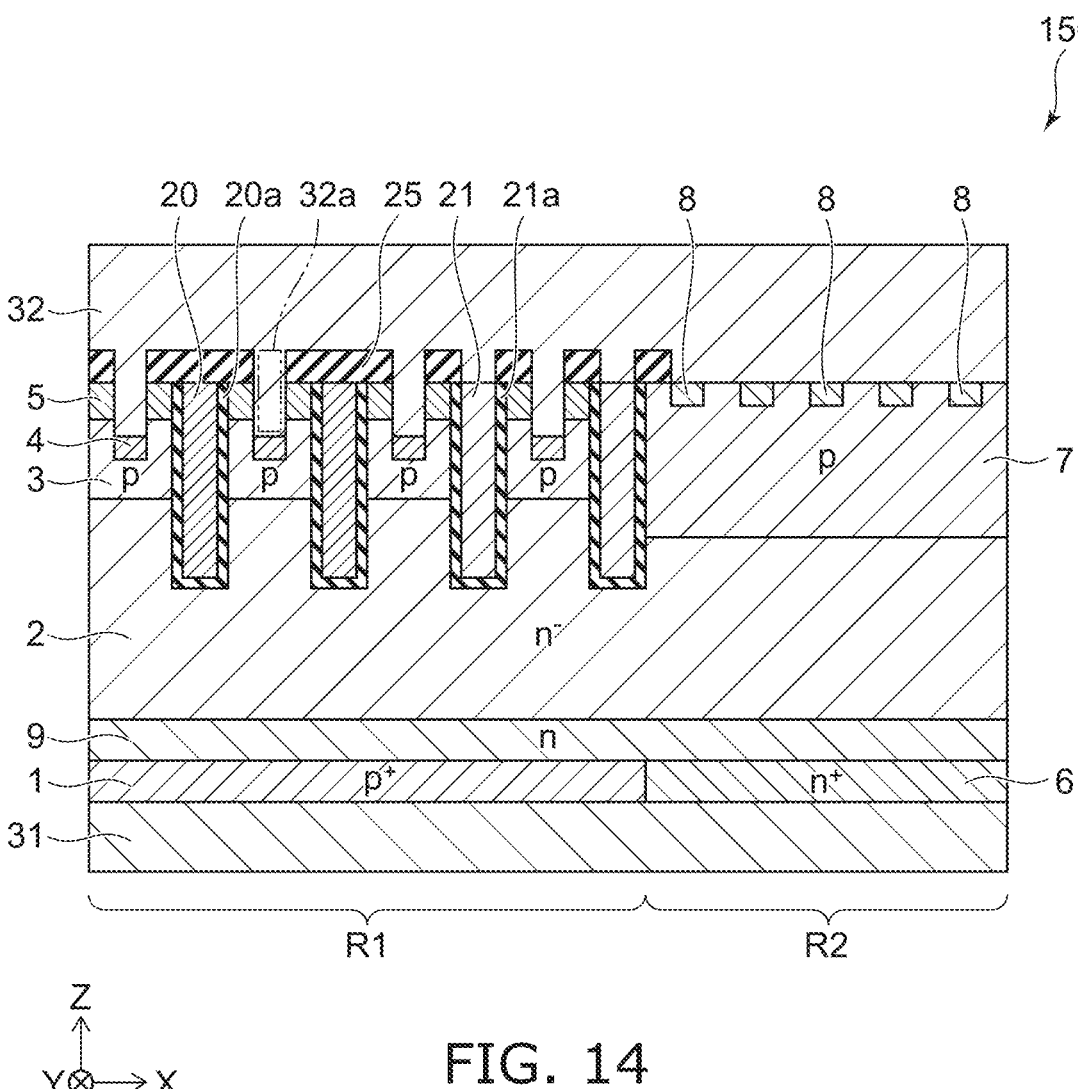
FIG. 14 is a cross-sectional view showing a portion of a semiconductor device according to a fifth modification of the embodiment.

FIG. 14 is a cross-sectional view showing a portion of a semiconductor device according to a fifth modification of the embodiment.

As in the semiconductor device 150 according to the fifth modification shown in FIG. 14, the conductive part 21 may be omitted from the diode region R2. The emitter electrode 32 may not include the contact part 32b in the diode region R2. In the diode region R2, the lower surface of the emitter electrode 32 exists at the same level as the upper surface of the p-type anode region 7 and the upper surface of the p$^+$-type anode region 8.

In the semiconductor devices 100 to 150 described above, the p-type impurity concentration of the p-type anode region 7 may be different from the p-type impurity concentration of the p-type base region 3. For example, the p-type impurity concentration of the p-type anode region 7 may be less than the p-type impurity concentration of the p-type base region 3. The amount of holes flowing from the emitter electrode 32 to the n$^-$-type base region 2 when the diode region R2 operates can be reduced thereby.

The Z-direction length of the p-type anode region 7 may be different from the Z-direction length of the p-type base region 3. For example, the p-n junction surface between the n$^-$-type base region 2 and the p-type anode region 7 is positioned lower than the p-n junction surface between the n$^-$-type base region 2 and the p-type base region 3.

The characteristics of the semiconductor devices 100 to 150 can be further increased by optimizing the surface structure of the IGBT region R1 and the surface structure of the diode region R2.

The size of the IGBT region R1 and the size of the diode region R2 are not limited to the illustrated examples, and are modifiable as appropriate. A narrower IGBT region R1 (in the X-direction) and a narrower diode region R2 may be arranged alternately in the X-direction.

Embodiments of the invention may include the following configurations.

(Configuration 1)

A semiconductor device, comprising:

a first electrode;

a second electrode separated from the first electrode, the second electrode including a contact part protruding toward the first electrode;

a first region located on a portion of the first electrode and positioned between the first electrode and the second electrode, the first region including a first semiconductor region of a first conductivity type, a second semiconductor region of a second conductivity type, a portion of the second semiconductor region being located on the first semiconductor region, and a third semiconductor region located on the portion of the second semiconductor region, the third semiconductor region being of the first conductivity type, the third semiconductor region including a first part and a second part, a gate electrode facing the third semiconductor region via a gate insulating layer in a second direction perpendicular to a first direction, the first direction being from the first electrode toward the second electrode, a fourth semiconductor region located between the third semiconductor region and the contact part in the first direction, the fourth semiconductor region being of the first conductivity type, a first-conductivity-type impurity concentration of the fourth semiconductor region being greater than a first-conductivity-type impurity concentration of the third semiconductor region, the fourth semiconductor region being arranged with the first part in a third direction perpendicular to the first and second directions, and a fifth semiconductor region located on the third semiconductor region, the fifth semiconductor region being of the second conductivity type, the fifth
semiconductor region contacting the contact part in
the second direction, the fifth semiconductor region
being arranged with the second part in the third
direction; and
a second region located on an other portion of the first
electrode and positioned between the first electrode and
the second electrode, the second region including
a sixth semiconductor region of the second conductiv-
ity type, the sixth semiconductor region having a
higher second-conductivity-type impurity concentra-
tion than the second semiconductor region,
an other portion of the second semiconductor region
located on the sixth semiconductor region, and
a seventh semiconductor region located on the other
portion of the second semiconductor region, the
seventh semiconductor region being of the first con-
ductivity type.
(Configuration 2)
The device according to Configuration 1, wherein
a position in the third direction of at least a portion of the
fourth semiconductor region is the same as a position in
the third direction of at least a portion of the fifth
semiconductor region.
(Configuration 3)
The device according to Configuration 1 or 2, wherein
a length in the third direction of the fourth semiconductor
region is greater than a length in the third direction of
the fifth semiconductor region.
(Configuration 4)
The device according to any one of Configurations 1 to 3,
wherein
the first part and the fourth semiconductor region are
alternately arranged in the third direction, and
the second part and the fifth semiconductor region are
alternately arranged in the third direction.
(Configuration 5)
The device according to Configuration 4, wherein
a distance in the third direction between adjacent fourth
semiconductor regions among the fourth semiconduc-
tor regions is greater than a length in the third direction
of one of the adjacent fourth semiconductor regions,
and
a distance in the third direction between adjacent fifth
semiconductor regions among the fifth semiconductor
regions is greater than a length in the third direction of
one of the adjacent fifth semiconductor regions.
(Configuration 6)
The device according to Configuration 4 or 5, wherein
a plurality of the first parts and a plurality of the fourth
semiconductor regions contact the contact part in the
first direction, and
a plurality of the second parts and a plurality of the fifth
semiconductor regions contact the contact part in the
second direction.
(Configuration 7)
The device according to Configuration 4 or 5, wherein
a plurality of the contact parts is arranged in the third
direction, and
the plurality of contact parts is located respectively on a
plurality of the fourth semiconductor regions.
(Configuration 8)
The device according to any one of Configurations 1 to 7,
wherein
the third semiconductor region includes a first subregion,
and a second subregion arranged with the first subre-
gion in the third direction,

the fourth semiconductor region and the fifth semicon-
ductor region are located on the first subregion,
the first part and the second part are located in the second
subregion, and
a first-conductivity-type impurity concentration of the
second subregion is less than a first-conductivity-type
impurity concentration of the first subregion.
According to the embodiments described above, the diode
region of the semiconductor device can operate faster.
In the embodiments, the relative level of impurity con-
centration between the semiconductor regions can be con-
firmed by, for example, using Scanning Capacitance Micro-
scope (SCM). The carrier concentration in each
semiconductor region can be considered equal to the con-
centration of impurities activated in each semiconductor
region. Accordingly, the relative level of the carrier concen-
tration between the semiconductor regions can also be
confirmed using the SCM. The impurity concentration in
each semiconductor region can be measured by, for
example, Secondary Ion Mass Spectrometry (SIMS).
While certain embodiments have been described, these
embodiments have been presented by way of example only,
and are not intended to limit the scope of the inventions.
Indeed, the novel embodiments described herein may be
embodied in a variety of other forms; furthermore, various
omissions, substitutions and changes in the form of the
embodiments described herein may be made without depart-
ing from the spirit of the inventions. The accompanying
claims and their equivalents are intended to cover such
forms or modifications as would fall within the scope and
spirit of the invention. Moreover, above-mentioned embodi-
ments can be combined mutually and can be carried out.
What is claimed is:
1. A semiconductor device, comprising:
a first electrode;
a second electrode separated from the first electrode, the
second electrode including a contact part protruding
toward the first electrode;
a first region located on a portion of the first electrode and
positioned between the first electrode and the second
electrode, the first region including
a first semiconductor region of a first conductivity type,
a second semiconductor region of a second conductiv-
ity type, a portion of the second semiconductor
region being located on the first semiconductor
region, and
a third semiconductor region located on the portion of
the second semiconductor region, the third semicon-
ductor region being of the first conductivity type, the
third semiconductor region including a first part and
a second part,
a gate electrode facing the third semiconductor region
via a gate insulating layer in a second direction
perpendicular to a first direction, the first direction
being from the first electrode toward the second
electrode,
a fourth semiconductor region located between the
third semiconductor region and the contact part in
the first direction, the fourth semiconductor region
being of the first conductivity type, a first-conduc-
tivity-type impurity concentration of the fourth semi-
conductor region being greater than a first-conduc-
tivity-type impurity concentration of the third
semiconductor region, the fourth semiconductor
region being arranged with the first part in a third
direction perpendicular to the first and second direc-
tions, and a fifth semiconductor region located on the third semiconductor region, the fifth semiconductor region being of the second conductivity type, the fifth semiconductor region contacting the contact part in the second direction, the fifth semiconductor region being arranged with the second part in the third direction; and a second region located on an other portion of the first electrode and positioned between the first electrode and the second electrode, the second region including a sixth semiconductor region of the second conductivity type, the sixth semiconductor region having a higher second-conductivity-type impurity concentration than the second semiconductor region, an other portion of the second semiconductor region located on the sixth semiconductor region, and a seventh semiconductor region located on the other portion of the second semiconductor region, the seventh semiconductor region being of the first conductivity type.

2. The device according to claim 1, wherein a position in the third direction of at least a portion of the fourth semiconductor region is the same as a position in the third direction of at least a portion of the fifth semiconductor region.

3. The device according to claim 1, wherein a length in the third direction of the fourth semiconductor region is greater than a length in the third direction of the fifth semiconductor region.

4. The device according to claim 1, wherein the first part and the fourth semiconductor region are alternately arranged in the third direction, and the second part and the fifth semiconductor region are alternately arranged in the third direction.

5. The device according to claim 4, wherein a distance in the third direction between adjacent fourth semiconductor regions among the fourth semiconductor regions is greater than a length in the third direction of one of the adjacent fourth semiconductor regions, and a distance in the third direction between adjacent fifth semiconductor regions among the fifth semiconductor regions is greater than a length in the third direction of one of the adjacent fifth semiconductor regions.

6. The device according to claim 4, wherein a plurality of the first parts and a plurality of the fourth semiconductor regions contact the contact part in the first direction, and a plurality of the second parts and a plurality of the fifth semiconductor regions contact the contact part in the second direction.

7. The device according to claim 4, wherein a plurality of the contact parts is arranged in the third direction, and the plurality of contact parts is located respectively on a plurality of the fourth semiconductor regions.

8. The device according to claim 1, wherein the third semiconductor region includes a first subregion, and a second subregion arranged with the first subregion in the third direction, the fourth semiconductor region and the fifth semiconductor region are located on the first subregion, the first part and the second part are located in the second subregion, and a first-conductivity-type impurity concentration of the second subregion is less than a first-conductivity-type impurity concentration of the first subregion.

* * * * *